United States Patent

Nasuno

(10) Patent No.: US 8,288,647 B2
(45) Date of Patent: Oct. 16, 2012

(54) PHOTOELECTRIC CONVERSION DEVICE AND METHOD OF PRODUCING THE SAME

(75) Inventor: Yoshiyuki Nasuno, Kashihara (JP)

(73) Assignee: Sharp Kabushiki Kaisha, Osaka (JP)

( * ) Notice: Subject to any disclaimer, the term of this patent is extended or adjusted under 35 U.S.C. 154(b) by 671 days.

(21) Appl. No.: 12/520,918

(22) PCT Filed: Nov. 15, 2007

(86) PCT No.: PCT/JP2007/072208
§ 371 (c)(1), (2), (4) Date: Jun. 23, 2009

(87) PCT Pub. No.: WO2008/078471
PCT Pub. Date: Jul. 3, 2008

(65) Prior Publication Data
US 2010/0024878 A1    Feb. 4, 2010

(30) Foreign Application Priority Data
Dec. 25, 2006 (JP) ................... 2006-347896

(51) Int. Cl.
*H01L 31/00* (2006.01)
(52) U.S. Cl. ......... 136/256; 136/255; 136/258; 136/261
(58) Field of Classification Search ............. 136/252, 136/256, 261, 258, 255
See application file for complete search history.

(56) References Cited

U.S. PATENT DOCUMENTS 4,471,155 A * 9/1984 Mohr et al. ................. 136/258

FOREIGN PATENT DOCUMENTS

| JP | 62-170478 | 7/1987 |
|----|-----------|--------|
| JP | 63-289968 | 11/1988 |
| JP | 64-71182 | 3/1989 |
| JP | 4-188774 | 7/1992 |
| JP | 7-183562 | 7/1995 |
| JP | 10-125944 | 5/1998 |
| JP | 10-294484 | 11/1998 |
| JP | 11-087742 | 3/1999 |
| JP | 11-266030 | 9/1999 |
| JP | 11-274530 | 10/1999 |
| JP | 2000-188413 | 7/2000 |
| JP | 2000-349321 | 12/2000 |
| JP | 2001-332749 | 11/2001 |
| JP | 2002-198551 | 7/2002 |
| JP | 2005-142358 | 6/2005 |
| JP | 2005142358 A * | 6/2005 |

OTHER PUBLICATIONS

International Search Report for PCT/JP2007/072208, mailed Dec. 11, 2007.

* cited by examiner

*Primary Examiner* — Jennifer Michener
*Assistant Examiner* — Eli Mekhlin
(74) *Attorney, Agent, or Firm* — Nixon & Vanderhye P.C.

(57) ABSTRACT

A photoelectric conversion device which can improve photoelectric conversion efficiency is provided. The photoelectric conversion device has at least one p-i-n type photoelectric conversion part which includes a first conductivity type layer, a first i-type layer, a second i-type layer and a second conductivity type layer stacked in this order, and it is characterized in that a crystallization ratio of the first i-type layer is lower than that of the second i-type layer and a change rate of a crystallization ratio in a film-thickness direction at an interface between the first i-type layer and the second i-type layer is 0.013 to 0.24 $nm^{-1}$.

5 Claims, 2 Drawing Sheets

US 8,288,647 B2

PHOTOELECTRIC CONVERSION DEVICE AND METHOD OF PRODUCING THE SAME

This application is the U.S. national phase of International Application No. PCT/JP2007/072208 filed 15 Nov. 2007, which designated the U.S. and claims priority to Japan Application No. 2006-347896 filed 25 Dec. 2006, the entire contents of each of which are hereby incorporated by reference.

TECHNICAL FIELD

The technology presented herein relates to a photoelectric conversion device and a method of producing the same.

BACKGROUND AND SUMMARY

Since fossil fuels such as petroleum and the like, which are used as electric power energy resources, raise concerns about a future shortage in supply in terms of residual reserves and have a problem of carbon dioxide emission causing a global warming phenomenon, photovoltaic cells receive widespread attention as alternative energy sources of the fossil fuels.

As a next-generation photovoltaic cell technology capable of reducing a cost, technology of a thin film photovoltaic cell is actively developed. The thin film silicon photovoltaic cell is prepared by depositing a silicon thin film of about several microns in thickness on a glass substrate or a stainless steel substrate by a plasma CVD method or the like. Accordingly, as a photovoltaic cell which can not only reduce an amount of silicon to be used to about one several-hundredths of the above bulk crystalline silicon photovoltaic cell, and but can also fabricate a photovoltaic cell having a large area in one film forming, leading to reduction in the cost, the thin film silicon photovoltaic cell receives increasing attention in recent years.

However, thin film silicon photovoltaic cells have started to be produced in quantity, but the production thereof has not reached a phase of a growing market. Increase in efficiency of the photovoltaic cell is a critical issue for a full-scale diffusion of the thin film silicon photovoltaic cell, and examples of a way to increase efficiency of the photovoltaic cell include quality-improvements in a junction interface of a semiconductor. A photoelectric conversion layer of the above-mentioned thin film silicon photovoltaic cell is generally formed of semiconductor thin films such as hydrogenated amorphous silicon or hydrogenated microcrystalline silicon. It should be noted that, in the present specification, a term "amorphous" is used as a synonym for "amorphous" generally used in this field. Further, a term "microcrystalline" includes not only a state in which a layer includes substantially only a crystal phase but also a state in which a crystal phase and an amorphous phase are present in a mixed state, as generally used in this field. For example, in Raman scattering spectra, if a sharp peak near 520 $cm^{-1}$, which belongs to a silicon-silicon bond in crystalline silicon is detected a little, this silicon is thought to be "microcrystalline silicon", and therefore a term "microcrystalline silicon" will be used herein in the same sense.

Further, a structure of a general thin film silicon photovoltaic cell often includes a p-i-n junction formed by a semiconductor layer (hereinafter, referred to as a p-type layer) exhibiting a p-conductivity type, an intrinsic semiconductor layer (hereinafter, referred to as an i-type layer), and a semiconductor layer (hereinafter, referred to as an n-type layer) exhibiting an n-conductivity type. Herein, the i-type layer may be one having characteristics which are considered to be substantially an intrinsic semiconductor and includes semiconductor layers having weak p-conductivity type or n-conductivity type.

In the p-i-n junction, an interface between a p-type and an i-type layers and an interface between an i-type and an n-type layers are objects of the above-mentioned quality-improvements in a junction interface of a semiconductor.

As a conventional technology concerning the quality-improvements in a junction interface of a semiconductor described above, for example, the following technology is disclosed in Japanese Unexamined Patent Publication No. 11-87742 (Patent Document 1). In a case of a silicon thin film photoelectric conversion device obtained by forming all semiconductor layers contained in a photoelectric conversion unit at a low temperature by a plasma CVD method, by introducing an extremely thin amorphous silicon thin film of a substantial i-type in an interface between a conductivity type layer to be a ground of a photoelectric conversion layer and the photoelectric conversion layer, a density of crystalline silicon having a small particle size causing generation of crystal nuclei in a crystalline silicon photoelectric conversion layer is moderately suppressed. That is, a density of crystal nuclei generated at an initial stage of growth of the photoelectric conversion layer is moderately suppressed and thereby, a high quality photoelectric conversion layer having less crystal boundaries and less defects in particles and crystals strongly oriented in one direction is obtained. Here, in particular, a problem is pointed out that when a conductivity type microcrystalline silicon film is used for an underlying layer, since a great number of crystalline silicon having a small particle size are present in the film, the crystalline silicon photoelectric conversion layer formed thereon generates a great number of crystal nuclei at an initial stage of growth thereof and consequently the crystalline silicon photoelectric conversion layer is apt to become a film having many crystal boundaries and many defects in particles adversely affecting photoelectric conversion characteristics.

On the other hand, Japanese Unexamined Patent Publication 2005-142358 (Patent Document 2) discloses a technology, in which in a photovoltaic cell including a substrate and a photoelectric conversion part formed on the substrate, the photoelectric conversion part includes a first conductivity type silicon layer, a crystalline silicon interlayer and an i-type crystalline silicon layer stacked in this order, and when a film thickness of the crystalline silicon interlayer is in a range of 5 to 100 nm and a crystallization ratio Xca of the crystalline silicon interlayer is in a range of 0.6 to 3, and a film thickness of the i-type crystalline silicon layer is in a range of 1 to 5 μm and a crystallization ratio Xcb of the i-type crystalline silicon layer is in a range of 2 to 8, a film of low quality at an initial stage of growth of the i-type crystalline silicon layer can be reduced because the crystalline silicon interlayer is inserted between the first conductivity type silicon layer and the i-type crystalline silicon layer, and simultaneously a high efficiency photovoltaic cell can be prepared by adjusting a crystallization ratio Xcb and a film thickness of the i-type crystalline silicon layer in a favorable range.

In any case, the underlying layer is used for quality-improvements in a crystalline silicon photoelectric conversion layer (i-type layer) formed on the underlying layer.

Patent Document 1: Japanese Unexamined Patent Publication 11-187742

Patent Document 2: Japanese Unexamined Patent Publication 2005-142358

However, since technologies represented by the above Patent Documents 1 and 2 only use an underlying layer for a purpose of improving quality of a crystalline silicon photoelectric conversion layer (i-type layer), there is still room for improvement viewing from a viewpoint of quality-improvement in a junction interface of a semiconductor.

The technology presented herein was made in view of such a situation, and it is a feature of the present technology to provide a photoelectric conversion device which can improve photoelectric conversion efficiency and a method of producing the same.

The photoelectric conversion device of an example embodiment presented herein has at least one p-i-n type photoelectric conversion part which includes a first conductivity type semiconductor layer (hereinafter, referred to as a "first conductivity type layer"), a first i-type layer, a second i-type layer and a second conductivity type semiconductor layer (hereinafter, referred to as a "second conductivity type layer") stacked in this order, and it is characterized in that a crystallization ratio of the first i-type layer is lower than that of the second i-type layer and a change rate of a crystallization ratio in a film-thickness direction at an interface between the first i-type layer and the second i-type layer (hereinafter, referred to as a "change rate of a crystallization ratio at an interface between the first i-type layer and the second i-type layer") is 0.013 to 0.24 nm$^{-1}$.

The present inventors made intense investigations, and consequently experimentally found that photoelectric conversion efficiency can be improved by setting the change rate of a crystallization ratio at an interface between the first i-type layer and the second i-type layer at 0.013 to 0.24 nm$^{-1}$. These findings have now led to completion of the present embodiment. An action of improving the efficiency is not necessarily clear, but it is thought that the action results from quality-improvements in a junction interface of a semiconductor.

Hereinafter, various embodiments will be exemplified.

The above-mentioned change rate of a crystallization ratio may be 0.017 to 0.10 nm$^{-1}$. In this case, the photoelectric conversion efficiency is further improved.

The above-mentioned second i-type semiconductor layer may be provided with a third i-type semiconductor layer on a side of the second conductivity type semiconductor layer, and a crystallization ratio of the third i-type semiconductor layer may be lower than the crystallization ratio of the second i-type semiconductor layer. In this case, the photoelectric conversion efficiency is further improved.

The first conductivity type layer may be a p-type and the second conductivity type layer may be an n-type.

Further, the present embodiment also provides a method of producing a photoelectric conversion device, including the step of forming at least a photoelectric conversion part including a first conductivity type layer, a first i-type layer, a second i-type layer and a second conductivity type layer on a substrate, in which at least one main surface of the substrate has electrical conductivity, by a plasma CVD method, wherein the second i-type layer is formed from a mixed gas of a silicon-containing gas and a hydrogen gas as process gases and the second i-type layer is formed by a method including the step of continuously reducing a flow ratio of hydrogen to silicon, which is defined by (hydrogen gas flow rate)/(silicon-containing gas flow rate), with plasma remaining on at an initial stage of forming the layer.

By this method, a photoelectric conversion device having a change rate of a crystallization ratio within the above-mentioned range can be produced with comparative ease.

The first i-type layer may be formed from a mixed gas of a silicon-containing gas and a hydrogen gas as process gases, and a value of a flow ratio of hydrogen to silicon of the second i-type layer at the time when the reduction in the flow ratio of hydrogen to silicon is initiated may be larger than that at the time of forming the first i-type layer. In this case, the photoelectric conversion device having a change rate of a crystallization ratio within the above-mentioned range can be further easily produced.

The method of producing a photoelectric conversion device of the present embodiment may further include the step of forming a third i-type layer on the second i-type layer on a side of the second conductivity type layer.

The first conductivity type layer may be a p-type and the second conductivity type layer may be an n-type.

Various embodiments shown herein can be combined with one another.

DESCRIPTION OF THE REFERENCE SYMBOLS

Figure 1:
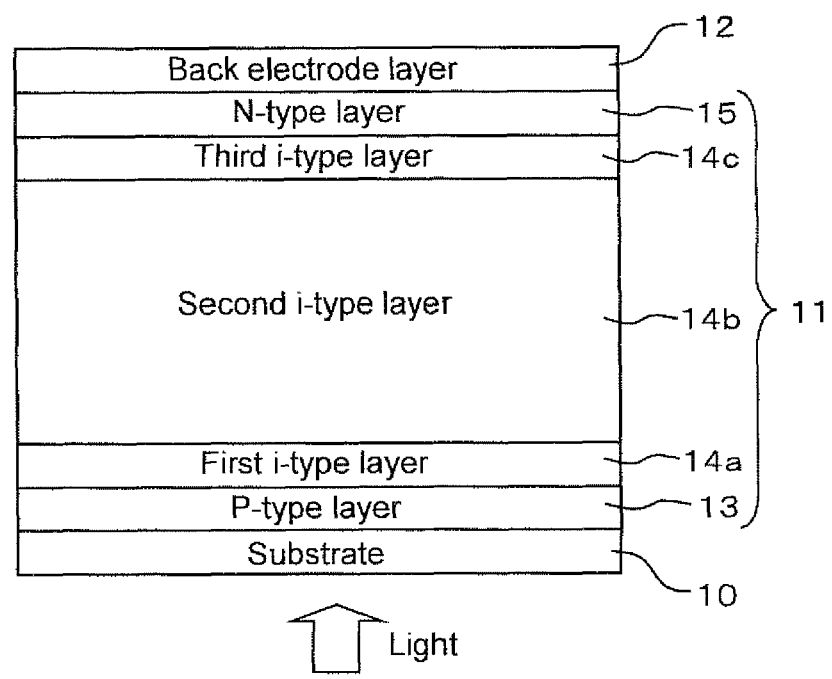
FIG. 1 is a schematic sectional view of a photoelectric conversion device of a superstrate type of a first embodiment.

10: Substrate, 11: Photoelectric conversion part, 12: Back electrode, 13: P-type layer, 14a: First i-type layer, 14b: Second i-type layer, 14c: Third i-type layer, 15: N-type layer

DETAILED DESCRIPTION

Hereinafter, embodiments will be described by use of drawings. Configurations shown in the drawings or the following descriptions are just exemplifications and the scope of the present embodiment is not limited to these exemplifications.

With reference to FIG. 1, a photoelectric conversion device of an embodiment of the will be described. FIG. 1 is a sectional view showing a structure of a photoelectric conversion device of the present embodiment.

The photoelectric conversion device of the present embodiment includes a substrate 10, and a photoelectric conversion part 11 and a back electrode layer 12 stacked in this order on the substrate 10 and has a superstrate structure in which light enters from the substrate side. However, the present invention may have a substrate type structure in which light enters from a side opposite to the substrate. Furthermore, even when the present invention have a structure of having a plurality of the photoelectric conversion parts, the same effect as in the present embodiment is exhibited.

1. Substrate

The substrate 10 is prepared by depositing a transparent conductive layer on a transparent substrate. As the transparent substrate, glass plates, transparent resin plates having heat resistance such as polyimide or polyvinyl, or a laminate thereof are suitably used, but the substrate 10 is not particularly limited as long as it has a high light transmitting property and can structurally support the whole photoelectric conversion device. Further, its surface may be coated with a metal film, a transparent conductive film, or an insulating film. However, when a photoelectric conversion device is applied to a structure of a substrate type in which light enters from a side opposite to the substrate, a non-transparent substrate such as stainless steel may be used in place of the above transparent substrate.

The transparent conductive layer is made of transparent conductive materials and for example, a monolayer or stacked layers of transparent conductive films such as ITO, tin oxide and zinc oxide may be used. Since the transparent conductive layer plays a role as an electrode, the transparent conductive layer having a high electrical conductivity is preferable. A transparent conductive layer in which an electrical conductivity is improved by doping a material with a trace of impurities can also be used. Example of a method of forming the transparent conductive layer include publicly known methods such as a sputtering method, a CVD method, an electron beam deposition method, a sol-gel method, a spraying method and an electrodeposition method.

Further, it is desirable that a texture structure is formed on a surface of the transparent conductive layer. Since this texture structure can refract and scatter incident light entering the photoelectric conversion device from the transparent substrate side to extend an optical path length of incident light, an optical confinement effect in the photoelectric conversion part 11 is enhanced and an improvement in a short circuit current can be expected. As a method of forming the texture structure on the surface of the transparent conductive layer, a method of forming the texture structure in which a transparent conductive layer is deposited on a transparent substrate once, and then a texture structure is formed by a mechanical processing such as etching or sandblast, a method of using a surface texture structure formed by crystal growth of a material for a transparent conductive film during depositing a transparent conductive film, or a method of using a regular surface texture structure formed because a plane of crystal growth is oriented may be employed.

In the present embodiment, as a substrate utilizing texture structures formed during growing crystals of a film material, a substrate formed by depositing a tin oxide layer on a white plate glass by a CVD method (manufactured by Asahi Glass Co., Ltd., trade name Asahi-U) can be used as the substrate 10. Furthermore, if a zinc oxide layer is deposited on the substrate 10 by a sputtering method, it is more preferable since the above tin oxide layer can prevent the photoelectric conversion layer from being damaged by plasma when the photoelectric conversion layer is formed later.

2. Photoelectric Conversion Part

The photoelectric conversion part 11 includes a first conductivity type layer, a first i-type layer 14a, a second i-type layer 14b and a third i-type layer 14c and a second conductivity type layer stacked in order from a substrate 10 side. The first conductivity type layer may be a p-type and the second conductivity type layer may be an n-type, or they may be an inverse type.

The photoelectric conversion device of the present embodiment is a superstrate type, and generally, the first conductivity type layer is a p-type and the second conductivity type layer is an n-type. In addition, when the photoelectric conversion device is a substrate type, generally, the first conductivity type layer is an n-type and the second conductivity type layer is a p-type. Accordingly, in the superstrate type, generally, a p-type layer, a first i-type layer 14a, a second i-type layer 14b, a third i-type layer 14c and an n-type layer are disposed in this order from a substrate 10 side, and in the substrate type, generally, an n-type layer, a first i-type layer 14a, a second i-type layer 14b, a third i-type layer 14c and a p-type layer are disposed in this order from a substrate 10 side.

Hereinafter, the photoelectric conversion part will be described taking a case where the first conductivity type layer is a p-type layer 13 and the second conductivity type layer is an n-type layer 15 as an example.

2-1 Constitution of Photoelectric Conversion Part

Each semiconductor layer forming the photoelectric conversion part 11 is made of a material which is predominantly composed of silicon. As the silicon, amorphous silicon, microcrystalline silicon, and the like are particularly suitably used. Here, in the present invention, the terms "amorphous silicon" and "microcrystalline silicon" respectively include "hydrogenated amorphous silicon" and "hydrogenated microcrystalline silicon" generally used in this field. Further, as materials for semiconductor layers, silicon alloys, in which a forbidden band is modified by adding elements such as carbon, germanium or the like, may be appropriately used.

Hereinafter, each semiconductor layer forming the photoelectric conversion part 11 will be described.

2-1-1. P-Type Layer

The p-type layer 13 is formed, for example, by doping a hydrogenated microcrystalline silicon semiconductor with impurity atoms to provide p-conductivity type such as boron or aluminum. Since the p-type layer 13 is not an optically active layer, a film thickness thereof is preferably thin to an extent that a photoelectric conversion function is not impaired. Accordingly, the film thickness of the p-type layer 13 is not particularly limited but it is preferably 100 nm or less, and more preferably 10 to 30 nm.

2-1-2. First to Third i-Type Layer

The first to third i-type layers 14a to 14c are hydrogenated microcrystalline silicon semiconductors not particularly doped with impurities. However, if these are substantially intrinsic semiconductors, they may include a small amount of impurity atoms. A total film thickness of the first to third i-type layers 14a to 14c is not particularly limited but it is desirably about 100 to 10000 nm from a viewpoint of not impairing a photoelectric conversion function and reducing a production cost.

The third i-type layer 14c can also be omitted, but installation of the third i-type layer 14c increases photoelectric conversion efficiency. As an example, the second i-type layer 14b is made of microcrystalline silicon, and the first i-type layer 14a and the third i-type layer 14c are made of microcrystalline silicon or amorphous silicon.

A crystallization ratio of the first i-type layer 14a is lower than that of the second i-type layer 14b. Further, a crystallization ratio of the third i-type layer 14c is preferably lower than that of the second i-type layer 14b. The crystallization ratio of the first i-type layer 14a is, for example, 0 to 4.5, and specifically, for example, 0, 0.5, 1, 1.5, 2, 2.5, 3, 3.5, 4 or 4.5. The crystallization ratio of the first i-type layer 14a may be a value between any adjacent two values of numeral values exemplified here. Further, the crystallization ratio of the second i-type layer 14b is, for example, 2 to 20, and specifically, for example, 2, 3, 4, 5, 6, 7, 8, 9, 10, 15 or 20. The crystallization ratio of the second i-type layer 14b may be a value between any adjacent two values of numeral values exemplified here. The crystallization ratio of the third i-type layer 14c is, for example, 0 to 4.5, and specifically, for example, 0, 0.5, 1, 1.5, 2, 2.5, 3, 3.5, 4 or 4.5. The crystallization ratio of the third i-type layer 14c may be a value between any adjacent two values of numeral values exemplified here. It should be noted that a crystallization ratio of a semiconductor layer means a crystallization ratio at a center in a film-thickness direction of the semiconductor layer.

The crystallization ratio can be measured by the following method.

(1) First, a photoelectric conversion part is polished at a bevel so as to form an angle of 0.07 degrees with respect to a main surface of a substrate. The angle formed with respect to a main surface of a substrate can be determined by measuring a polished length and a film thickness using a step height-film thickness meter and an electron microscope (SEM). Polishing at a bevel can be performed by using means for preparing a sample, such as polishing by a grinder using diamond slurry and etching by focused ion beams (FIB), for an observation by a transmission electron microscope (TEM).

Figure 2:
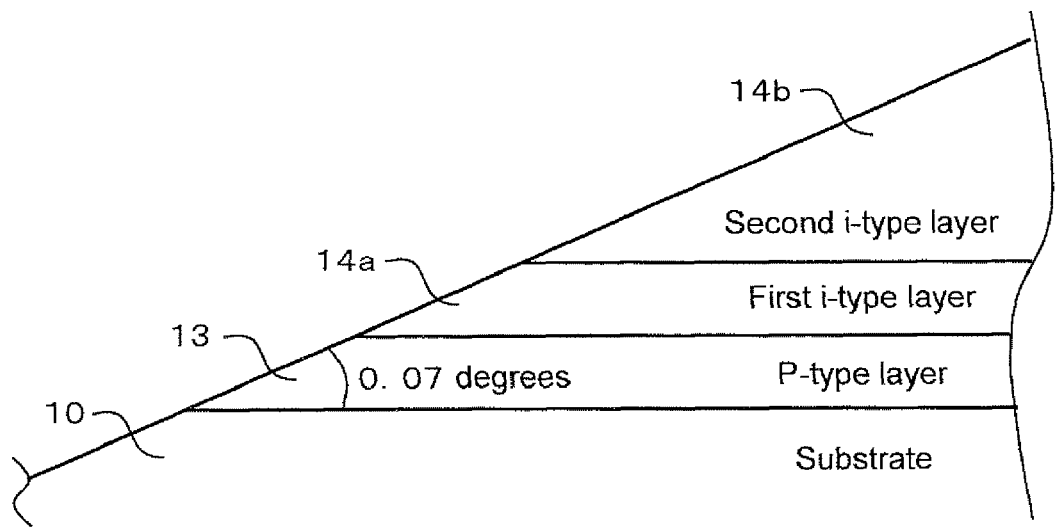
FIG. 2 is a schematic diagram of a cross-section of a sample formed by polishing at a bevel a stacked layer similar to that of the photoelectric conversion device of the present embodiment.

An example of the sample polished at a bevel is shown in FIG. 2 as a sectional view. Cross sections of the substrate 10, the p-type layer 13, the first i-type layer 14a, the second i-type layer 14b, the third i-type layer 14c and the n-type layer 15 are arranged in order in a polishing direction at the surface polished at a bevel of the sample in FIG. 2.

(2) Next, a semiconductor layer of a measuring object in a surface polished at a bevel of the sample polished at a bevel is irradiated with laser to measure Raman scattering spectra. Specifically, the Raman scattering spectra are obtained by measuring at an exposure time of 60 seconds using a Micro-Laser-Raman spectrometer (e.g.: NRS-2100 manufactured by JASCO Corporation) in which power is about 10 mW and argon ion laser (wavelength 514.5 nm) of about 1 μm in diameter is used as probe light.

(3) Next, in the obtained Raman scattering spectra, a ratio (Ic/Ia) between a peak height (Ic) of a sharp peak near 520 $cm^{-1}$, which belongs to a silicon-silicon bond in crystalline silicon and a peak height (Ia) of a broad peak near 480 $cm^{-1}$, which belongs to a silicon-silicon bond in amorphous silicon is determined, and an obtained value is taken as a crystallization ratio.

Next, an effect achieved by reducing the crystallization ratio of the first i-type layer 14a to less than the crystallization ratio of the second i-type layer 14b will be described below.

Generally, microcrystalline silicon is a material in which a microcrystalline phase and an amorphous phase are present in a mixed state, and it is thought that practicable semiconductor characteristics are obtained because a grain boundary undergoes passivation by the amorphous phase. Here, it is known that when the crystallization ratio is increased, an amorphous layer which passivates grain boundaries is reduced, and therefore a neutral defect density, which is likely to result from non-bonding hand of silicon which can be evaluated by an electron spin resonance (ESR) method, is increased.

Accordingly, it is a promising means for improving quality as an optical active layer (i-type layer) of the photoelectric conversion device to keep the crystallization ratio low, and it is reported that this can realize a high open circuit voltage and a fill factor. However, when this is applied to the photoelectric conversion device, it is desired that light in a wider range of wavelength is absorbed. In this point, a high crystallization ratio is preferable because absorption of light of a longer wavelength is increased and a short circuit current density can be improved.

The present inventors made intense investigations in order to realize simultaneous pursuit of an improvement in the above-mentioned "open circuit voltage and fill factor" and an improvement in "a short circuit current density", and consequently found that even when the crystallization ratio of the second i-type layer 14b is increased to a relatively large value (for example, when the crystallization ratio is increased to 15) for improving the short circuit current density, the open circuit voltage and the fill factor can be improved when the crystallization ratio of the first i-type layer 14a is reduced to less than the crystallization ratio of the second i-type layer 14b. Further, the present inventors found that even when the crystallization ratio of the second i-type layer 14b is decreased to a relatively small value (for example, when the crystallization ratio is decreased to 4), the open circuit voltage and the fill factor can be improved when the crystallization ratio of the first i-type layer 14a is reduced to less than the crystallization ratio of the second i-type layer 14b. Therefore, it is understood that the open circuit voltage and the fill factor can be improved by reducing the crystallization ratio of the first i-type layer 14a to less than the crystallization ratio of the second i-type layer 14b irrespective of a value of the crystallization ratio of the second i-type layer 14b.

The contents described here hold true for an effect achieved by reducing the crystallization ratio of the third i-type layer 14c to less than the crystallization ratio of the second i-type layer 14b.

Since the first i-type layer 14a and the third i-type layer 14c have a narrower wavelength range of light absorption than the second i-type layer 14b, the film thicknesses of the first i-type layer 14a and the third i-type layer 14c are preferably small to an extent that an effect of the present invention is exhibited for absorbing light effectively, and for example, their film thicknesses are preferably 5 nm or more and 100 nm or less. However, when the crystallization ratios of the first i-type layer 14a and the third i-type layer 14c are respectively less than 1 (including a case of perfect amorphous silicon), their film thicknesses are preferably 3 nm or more and 12 nm or less since there is an upper limit of the thickness at which the photoelectric conversion efficiency drops sharply when the film thicknesses of the first i-type layer 14a and the third i-type layer 14c are increased gradually.

Further, a change rate of a crystallization ratio at an interface between the first i-type layer 14a and the second i-type layer 14b is 0.013 to 0.24 $nm^{-1}$. This change rate of a crystallization ratio at an interface is, for example, 0.013, 0.015, 0.017, 0.02, 0.03, 0.04, 0.05, 0.06, 0.07, 0.08, 0.09, 0.10, 0.11, 0.12, 0.13, 0.14, 0.15, 0.16, 0.17, 0.18, 0.19, 0.20, 0.21, 0.22, 0.23 or 0.24 $nm^{-1}$. This change rate of a crystallization ratio at an interface may be a value between any adjacent two values of numeral values exemplified here.

The change rate of a crystallization ratio at an interface between the first i-type layer 14a and the second i-type layer 14b can be measured by the following method.

(1) The sample polished at a bevel by the above-mentioned method is set up on a stage, and this stage is moved in a direction of polishing at a bevel and the surface polished at a bevel is irradiated with probe light to measure Raman scattering spectra and the movement of the stage and the probe light irradiation are repeated to determine a crystallization ratio at each measuring position.

Raman scattering spectra derived from a semiconductor layer can be obtained at a position at which the p-type layer 13 appears in an outermost surface, but such Raman scattering spectra cannot be obtained at a position at which the substrate 10 appears in the outermost surface. Accordingly, a stage position corresponding to an interface between the substrate 10 and the p-type layer 13 can be identified. Using a stage travel distance from a position corresponding to this interface and a polishing angle, a measurement position can be converted to a position in a film-thickness direction. Thereby, a relationship between a position in a film-thickness direction and a crystallization ratio at that position can be obtained, and a graph showing a relationship between a position in a film-thickness direction and a crystallization ratio at that position as shown in FIG. 3 based on this relationship can be obtained.

In addition, since Raman scattering light provides information in a range of film thickness in accordance with an absorption depth of probe light, even when semiconductor layers are stacked under deposition conditions in which the crystallization ratios of the semiconductor layers are significantly different from one another, measurements of the crystallization ratio in a sample polished at a bevel exhibit continuous changes. When a photoelectric conversion device having a substrate having a texture structure on the surface for a purpose of improving an optical confinement effect is polished at a bevel to obtain a sample, a plurality of layers are present in the outermost surface in a narrow range irradiated with probe light. A measured value is thought to be an average derived from the plurality of layers existing within the range irradiated with probe light, but even in this case, a relationship between a position in a film-thickness direction and a crystallization ratio at that position can be obtained.

Figure 3:
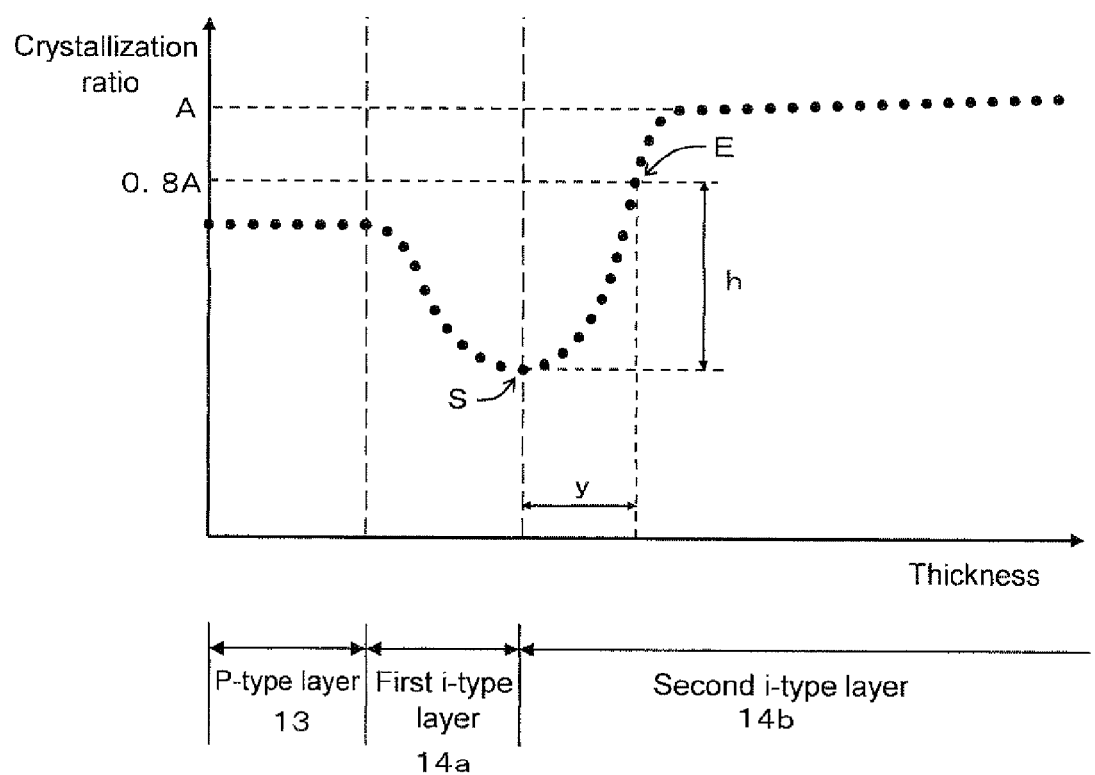
FIG. 3 is a schematic diagram showing a change in a film-thickness direction of a crystallization ratio of the specimen polished at a bevel.

(2) Next, a change rate of a crystallization ratio at an interface between the first i-type layer 14a and the second i-type layer 14b is determined using a graph showing a relationship between a position in a film-thickness direction and a crystallization ratio at that position as shown in FIG. 3. The change rate of a crystallization ratio at an interface can be obtained by (change amount h of a crystallization ratio at a crystallization ratio changing layer/film thickness y of a crystallization ratio changing layer). A starting point S of the crystallization ratio changing layer is a point where the crystallization ratio becomes a minimum. An end point E of the crystallization ratio changing layer is determined by the following method. (a) Measured values at a location, in which the changes in the crystallization ratio of the second i-type layer 14b relative to the film thickness are relatively mild, are extrapolated toward the first i-type layer 14a, and a crystallization ratio A at a minimum film thickness at which this extrapolated line coincides with the crystallization ratio of the measured value is determined. (b) Next, a point at which the crystallization ratio becomes 0.8 A is determined and this point is taken as an end point E.

When the change rate of a crystallization ratio at an interface between the first i-type layer 14a and the second i-type layer 14b is 0.013 to 0.24 $mm^{-1}$, photoelectric conversion efficiency can be improved since a film thickness of the first i-type layer 14a can be reduced. Particularly, when the crystallization ratio of the first i-type layer 14a is less than Ic/Ia=1 (including a case of perfect amorphous silicon), it is preferable that the crystallization ratio changes sharply at the interface since it is necessary to adjust its film thickness to an extremely small thickness.

Further, it is reported that higher photoelectric conversion characteristics are obtained as a size of crystallite, which is generally determined using a Scherrer's equation based on results of X-ray diffraction measurement, of the i-type layer of microcrystalline silicon is increased and as an intensity ratio of a 220 diffraction line to a 111 diffraction line ((intensity of a 220 diffraction line)/(intensity of a 111 diffraction line)) is increased (220 diffraction line has high orientation. In accordance with the present invention, even when a size of the above-mentioned crystallite in the second i-type layer 14b is as relatively small as about 10 to 30 nm and the above-mentioned intensity ratio ((intensity of a 220 diffraction line)/(intensity of a 111 diffraction line)) is as small as less than 3, high photoelectric conversion efficiency can be realized. Therefore, the first i-type layer 14a may be one not having an effect of increasing the size of the above-mentioned crystallite in the second i-type layer 14b and not having an effect of improving the above-mentioned intensity ratio ((intensity of a 220 diffraction line)/(intensity of a 111 diffraction line)) as long as its crystallization ratio is controlled.

2-1-3. N-Type Layer

The n-type layer 15 is formed, for example, by doping a hydrogenated microcrystalline silicon semiconductor or a hydrogenated amorphous silicon semiconductor with impurity atoms to provide n-conductivity type such as phosphorus, nitrogen, oxygen or the like. Since the n-type layer 15 is not an optically active layer, a film thickness thereof is preferably thin to an extent that a photoelectric conversion function is not impaired. Accordingly, the film thickness of the n-type layer 15 is not particularly limited but it is preferably 100 nm or less, and more preferably 10 to 30 nm.

2-2. Preparation Method of Photoelectric Conversion Part

Next, a preparation method of the photoelectric conversion part 11 will be described.

The photoelectric conversion part 11 can be formed by forming a p-type layer 13, a first i-type layer 14a, a second i-type layer 14b, a third i-type layer 14c and an n-type layer 15 on a substrate 10. In addition, when the present invention is applied to a structure of a substrate type to use a structure in which a p-type layer is disposed on a light entrance side, the n-type layer, the first i-type layer 14a, the second i-type layer 14b, the third i-type layer 14c and the p-type layer are formed in this order from the substrate 10 side. The third i-type layer 14c can be omitted.

The respective semiconductor layers forming the photoelectric conversion part 11 can be formed by using a plasma CVD method using a frequency band from RF to VHF. As conditions of preparation in a case of using a parallel plate type plasma-enhanced CVD method, for example, a frequency of about 10 to 200 MHz, a power density of about 10 $mW/cm^2$ to 1 $W/cm^2$, a chamber internal pressure of about 100 to 2000 Pa, and a substrate temperature of about room temperature to 300° C. are suitably employed.

The silicon-containing gas to be used in forming each semiconductor layer of the photoelectric conversion part 11 by a plasma CVD method is not particularly limited as long as it includes silicon atoms such as $SiH_4$, $Si2H_6$, $SiF_4$, $SiH_2Cl_2$, and $SiCl_4$, but generally, $SiH_4$ is often used. As a dilution gas used together with the above-mentioned silicon-containing gas, $H_2$ is principally used. Herein, a small amount of a dilution gas such as Ar, He or the like may be mixed.

Here, in order to form microcrystalline silicon, a flow ratio of hydrogen to silicon, which is defined by (hydrogen gas flow rate)/(silicon-containing gas flow rate), is important. For example, when $SiH_4$ is used as a silicon-containing gas, a flow ratio of hydrogen to silicon at the time of forming microcrystalline silicon is preferably about 35 to 70. In addition, a flow ratio of hydrogen to silicon at the time of forming amorphous silicon is preferably about 1 to 40.

Further, conditions of forming microcrystalline silicon are significantly influenced by a crystallization ratio of an underlying layer. That is, since the underlying layer having a higher crystallization ratio is more susceptible to crystallization, a proper value of the flow ratio of a silicon-containing gas to hydrogen ($H_2$) becomes low, and when a crystallization ratio of the underlying layer is low or the underlying layer is entirely amorphous silicon, a proper value of the flow ratio of a silicon-containing gas to $H_2$ becomes high. Thereby, microcrystalline silicon previously crystallized comes to act as an underlying layer even when the microcrystalline silicon is formed under a condition in which a flow ratio is constant, and therefore the crystallization ratio tends to increase as a film thickness increases.

A doping gas is used together with the above-mentioned silicon-containing gas and a dilution gas when the p-type layer 13 and the n-type layer 15 are formed, and the doping gas is not particularly limited as long as it is a gas including a determinant element of the conductivity of a desired type. Generally, when a determinant element of p-conductivity type is boron, $B_2H_6$ is suitably used. Generally, when a determinant element of n-conductivity type is phosphorus, $PH_3$ is suitably used.

Hereinafter, a method of forming the first to third i-type layers 14a to 14c will be described in detail.

First, the first i-type layer 14a is formed under a condition in which a flow ratio of hydrogen to silicon is relatively small. Thereby, the crystallization ratio of the first i-type layer 14a becomes relatively small. A flow ratio of hydrogen to silicon at the time of forming the first i-type layer 14a is, for example, 1 to 50, and specifically, for example, 1, 5, 10, 15, 20, 25, 30, 35, 40, 45 or 50. This flow ratio of hydrogen to silicon may be a value between any adjacent two values of numeral values exemplified here. Further, a ratio of (flow ratio of hydrogen to silicon at the time of forming the first i-type layer 14a) to (flow ratio of hydrogen to silicon at the time of forming the second i-type layer 14b) is, for example, 0.1 to 0.9, and specifically, for example, 0.1, 0.2, 0.3, 0.4, 0.5, 0.6, 0.7, 0.8 or 0.9. This ratio may be a value between any adjacent two values of numeral values exemplified here. When the flow ratio of hydrogen to silicon varies during forming each layer, its average is "a flow ratio of hydrogen to silicon" of the layer.

Next, the second i-type layer 14b is formed on the first i-type layer 14a under a condition in which a flow ratio of hydrogen to silicon is relatively large. Thereby, the crystallization ratio of the second i-type layer 14b becomes relatively large. A flow ratio of hydrogen to silicon at the time of forming the second i-type layer 14b is, for example, 35 to 70, and specifically, for example, 35, 40, 45, 50, 55, 60, 65 or 70. This flow ratio of hydrogen to silicon may be a value between any adjacent two values of numeral values exemplified here.

The second i-type layer 14b is apt to become low in the crystallization ratio at an initial stage of forming the layer. This is attributed to the fact that (1) the second i-type layer 14b is formed on the first i-type layer 14a having a comparatively low crystallization ratio and (2) it takes a fixed duration in time to reach a stable discharge since the decomposition of the process gases start from an initiation of discharge and the discharge is stabilized after supply of process gases is balanced with electric power supply for discharge. In such a case, since the change rate of a crystallization ratio at an interface between the first i-type layer 14a and the second i-type layer 14b becomes small, it becomes difficult to set the change rate of a crystallization ratio at 0.013 to 0.24 $nm^{-1}$.

Thus, in order to increase the change rate of a crystallization ratio at an interface between the first i-type layer 14a and the second i-type layer 14b, in the present embodiment, the step of continuously reducing a flow ratio of hydrogen to silicon with plasma remaining on at an initial stage of forming the second i-type layer 14b is provided. Since the flow ratio of hydrogen to silicon is high during performing this step, the crystallization ratio increases rapidly, and therefore it is possible to set the change rate of a crystallization ratio at an interface between the first i-type layer 14a and the second i-type layer 14b at 0.013 to 0.24 $nm^{-1}$.

In order to increase the flow ratio of hydrogen to silicon, a flow rate of a hydrogen gas may be increased, or a flow rate of a silicon-containing gas (e.g.: $SiH_4$ gas) may be decreased, or these gases may be used in combination. For example, the flow ratio of hydrogen to silicon can be increased by setting a flow rate of a silicon-containing gas at an initial stage of the formation of the second i-type layer 14b at 70 to 90% of the flow rate of the gas at the end of the formation of the second i-type layer 14b. Further, a ratio of a time during which a silicon-containing gas flow rate is reduced to a time to form the second i-type layer 14b is, for example, 1/100 to 1/6, and specifically, for example, 1/100, 1/50, 1/25, 1/20, 1/15, 1/10, 1/9, 1/8, 1/7 or 1/6. The above ratio may be a value between any adjacent two values of numeral values exemplified here.

Here, since a proper value of a flow rate of a silicon-containing gas at an initial stage of the formation of the layer tends to become small when a pressure during the formation of a layer is high and a charged power during the formation of a layer is large, it is preferable to set the conditions taking these points into account. Further, changes in a flow rate of the silicon-containing gas needs to be carried out without stopping the plasma discharge along the way because of the reason described above. Further, it is preferable that the crystallization ratio changes sharply at the interface between the first i-type layer 14a and the second i-type layer 14b and the crystallization ratio in a film thickness direction of the second i-type layer 14b may be constant, may be increased gradually, or may be reduced gradually.

Next, the third i-type layer 14c is formed on the second i-type layer 14b under the condition in which a flow ratio of hydrogen to silicon is relatively small. Thereby, the crystallization ratio of the third i-type layer 14c becomes relatively small. A flow ratio of hydrogen to silicon at the time of forming the third i-type layer 14c is, for example, 1 to 50, and specifically, for example, 1, 5, 10, 15, 20, 25, 30, 35, 40, 45 or 50. This flow ratio of hydrogen to silicon may be a value between any adjacent two values of numeral values exemplified here. In other words, a ratio of (flow ratio of hydrogen to silicon at the time of forming the third i-type layer 14c) to (flow ratio of hydrogen to silicon at the time of forming the second i-type layer 14b) is, for example, 0.1 to 0.7, and specifically, for example, 0.1, 0.2, 0.3, 0.4, 0.5, 0.6 or 0.7. This ratio may be a value between any adjacent two values of numeral values exemplified here.

3. Back Electrode Layer

The back electrode layer 12 may have at least one conductive layer and preferably has a higher optical reflectance and a higher conductivity. As a material satisfying these requirements, metal materials such as silver, aluminum, titanium, palladium and the like, which have a high reflectance of visible light, or alloys thereof are used. A method of preparing the back electrode layer is not particularly limited, and for example, the back electrode layer is formed on the above photoelectric conversion part 11 by a CVD method, a sputtering method, a vacuum deposition method, an electron beam deposition method, a spraying method, a screen printing method, or the like.

The back electrode layer 12 contributes to improvement in the photoelectric conversion efficiency since this layer reflects the light which has not been entirely absorbed in the photoelectric conversion part 11 to return it to the photoelectric conversion part 11 again. Furthermore, if a transparent conductive layer is formed between the photoelectric conversion part 11 and the back electrode layer 12, an effect of improving optical confinement or an effect of improving an optical reflectance for incident light, respectively, can be achieved, and in addition to these, the diffusion of elements contained in the back electrode layer 12 into the photoelectric conversion part 11 can be inhibited.

The transparent conductive layer can be formed by using a similar material and a similar method as in the transparent conductive layer described in a section of "1. Substrate". However, when the present invention is applied to the structure of a substrate type, the abovementioned back electrode layer is preferably in a shape of a grid (a shape of a comb, etc.), which does not cover the surface uniformly, since light enters from the back electrode layer 12 side.

With the above-mentioned configuration, a photoelectric conversion device, in which the open circuit voltage and the short circuit current density are high, a form factor is large and the photoelectric conversion efficiency is high, can be obtained.

EXAMPLES

Hereinafter, Examples and Comparative Examples of the present embodiment will be described.

Examples 1 to 3 and Comparative Examples 1 and 2

In Examples 1 to 3 and Comparative Examples 1 and 2, a photoelectric conversion device of a superstrate type shown in FIG. 1 was prepared as follows.

As the substrate 10, a white plate glass including a transparent conductive film formed on a surface of a substrate (trade name: Asahi-U) was used. A p-type layer 13, a first i-type layer 14a, a second i-type layer 14b, a third i-type layer 14c and an n-type layer 15 were deposited in this order on the substrate 10 by a plasma CVD method to form a photoelectric conversion part 11. The conditions of plasma CVD which are common to each layer are a film-forming pressure of 1000 Pa, a plasma frequency of 13.56 MHz, a charged electrical power of 100 mW/cm$^2$, and a substrate temperature of 200° C.

$SiH_4$, $H_2$, and $B_2H_6$ were used as process gases for producing a p-type layer 13, and proportion of gas flow rates of $H_2$, $SiH_4$, and $B_2H_6$ was set at 260:1:0.0025. Further, a film-forming time was adjusted in such a way that a film thickness is 30 nm.

$SiH_4$ and $H_2$ were used as process gases for producing a first i-type layer 14a, and proportion of gas flow rates of $H_2$ and $SiH_4$ was set at 35:1. Further, a film-forming time was adjusted in such a way that a film thickness is 10 nm.

$SiH_4$ and $H_2$ were used as process gases for producing a second i-type layer 14b. The proportion of gas flow rates of $H_2$ and $SiH_4$ was set at 63:1 at an initial stage of forming the layer. Further, a flow rate of $SiH_4$ was increased gradually after the initiation of the formation of the second i-type layer 14b in such a way that the proportion of gas flow rates of $H_2$ and $SiH_4$ is 53:1 after a lapse of x minutes from the initiation of plasma discharge (that is, the initiation of the formation of the second i-type layer 14b). The flow rate of $SiH_4$ was kept constant after a lapse of x minutes. Discharging was completed (that is, the formation of the second i-type layer 14b was completed) after a lapse of 100 minutes from the initiation of plasma discharge. A gas flow rate was controlled without stopping the discharge during the formation of the second i-type layer 14b. This is because if the discharge is stopped along the way, control of the flow rate have to be started again.

The times during which a silane gas flow rate is controlled (x minutes) are shown in Table 2. The times during which a silane gas flow rate is controlled (x minutes) were set at 0 minute, 2.5 minutes, 5 minutes, 15 minutes and 20 minutes, respectively, for Comparative Example 1, Example 1, Example 2, Example 3 and Comparative Example 2. In Comparative Example 1, the proportion of gas flow rates of $H_2$ and $SiH_4$ was changed directly from 35:1 to 53:1.

Flow rates of the process gases were adjusted in such a way that a change in the proportion of gas flow rates is nearly constant during the time during which silane gas flow rate is controlled (x minutes). Further, a total film thickness of the second i-type layer 14b was 2000 nm.

$SiH_4$ and $H_2$ were used as process gases for producing a third i-type layer 14c, and the proportion of gas flow rates of $H_2$ and $SiH_4$ was set at 35:1. Further, a film-forming time was adjusted in such a way that a film thickness is 10 nm.

$SiH_4$, $H_2$, and $PH_3$ were used as process gases for producing an n-type layer 15, and proportion of gas flow rates of $H_2$, $SiH_4$, and $PH_3$ was set at 200:1:0.003. Further, a film-forming time was adjusted in such a way that a film thickness is 30 nm.

Thus, a photoelectric conversion part 11 can be produced.

Two layers of a zinc oxide layer having a thickness of 30 nm and a silver layer having a thickness of 500 nm are deposited in this order on the photoelectric conversion part 11 as a back electrode layer 12 by a magnetron sputtering method to obtain a photoelectric conversion device of a superstrate type.

A current-voltage characteristic at a cell area of 1 cm$^2$ of the photoelectric conversion device thus obtained was measured under an irradiation condition of AM 1.5 (100 mW/cm$^2$). Results of measurement are shown in Table 2.

Example 4

A photoelectric conversion device was prepared in the same manner as in Example 2 except for not having the third i-type layer 14c. Photoelectric conversion efficiency was measured under the same measuring condition as in Example 2. Results of measurement are shown in Table 2.

Conventional Example 1

A photoelectric conversion device was prepared in the same manner as in Example 2 except for not having the first i-type layer 14a and the third i-type layer 14c and not controlling a silane gas flow rate. Photoelectric conversion efficiency was measured under the same measuring condition as in Example 2. Results of measurement are shown in Table 2.

Further, with respect to Examples 1 to 4 and Comparative Examples 1 to 2, each photoelectric conversion device was polished by bevel polishing at a low angle to expose layers to become a measuring object of Raman spectrometry in such a way that an exposed area in an in-plane direction of a substrate becomes as large as possible. A method of polishing a photoelectric conversion device is as follows. First, the photoelectric conversion device was polished at a bevel at a low angle using diamond slurry having an average particle size of 0.25 μm, and then was polished at a bevel at a low angle using colloidal silica having an average particle size of 0.06 μm. Thereafter, an angle of the polished surface was measured using a step height-film thickness meter and an electron microscope (SEM) to obtain 0.07 degrees.

A micro-Raman scattering measurement was implemented for positions corresponding to the respective layers on the photoelectric conversion devices polished at a bevel at a low angle using a triple monochromator Raman spectrometer (manufactured by JASCO Corporation, NRS-2100) to obtain Raman scattering spectra. A measuring condition is to irradiate the layers at a spot having about 1 μm in diameter with argon ion laser (wavelength 514.5 nm) having power of about 10 mW for 60 seconds of an exposure time. A peak height (Ic) near 520 cm$^{-1}$ and a peak height (Ia) near 480 cm$^{-1}$, were determined based on the resulting Raman spectra to calculate a crystallization ratio (Ic/Ia) of a position to be evaluated.

The crystallization ratios at a center in a film-thickness direction of the p-type layer 13, the first i-type layer 14a, the second i-type layer 14b, the third i-type layer 14c and the n-type layer 15 are as shown in Table 1.

TABLE 1

| | Crystallization ratio |
|---|---|
| P-type layer 13 | 5 |
| First i-type layer 14a | 3.7 |
| Second i-type layer 14b | 5 |
| Third i-type layer 14c | 3.7 |
| N-type layer 15 | 5 |

Further, the change rate of a crystallization ratio at an interface between the first i-type layer 14a and the second i-type layer 14b was determined by the above-mentioned method. Results are shown in Table 2. In addition, the crystallization ratio at a starting point S of a crystallization ratio changing layer was 3.5.

TABLE 2

| | Time during which silane gas flow rate is controlled x (minute) | Film thickness of crystallization ratio changing layer y (nm) | Change rate of crystallization ratio (nm$^{-1}$) | Photoelectric conversion efficiency (%) |
|---|---|---|---|---|
| Comparative Example 1 | 0 | 40 | 0.01 | 7.8 |
| Example 1 | 2.5 | 30 | 0.017 | 8.6 |
| Example 2 | 5 | 10 | 0.05 | 9.5 |
| Example 3 | 15 | 5 | 0.10 | 9.4 |
| Comparative Example 2 | 20 | 2 | 0.25 | 8.2 |
| Example 4 | 5 | 10 | 0.05 | 9.3 |
| Conventional Example 1 | — | — | — | 8.1 |

Referring to Table 2, it is found that when the change rate of a crystallization ratio at an interface between the first i-type layer 14a and the second i-type layer 14b is 0.017 to 0.10 nm$^{-1}$, the photoelectric conversion efficiency became high. Further, referring to Table 2, it is found that when this change rate of a crystallization ratio is 0.013 to 0.24 nm$^{-1}$, the photoelectric conversion efficiency became high. Furthermore, it is found that when this change rate of a crystallization ratio is 0.05 to 0.10 nm$^{-1}$, the photoelectric conversion efficiency became extremely high.

Further, from a comparison between Example 2 and Example 4, it is found that the photoelectric conversion efficiency was improved by disposing the third i-type layer 14c.

The reason why high photoelectric conversion efficiency was not achieved in Comparative Example 2 is not necessarily clear, but this is thought to be as follows. In Comparative Example 2, a layer having a higher crystallization ratio than the crystallization ratio A was formed behind the end point E of the crystallization ratio changing layer because time during which a silane gas flow rate is controlled is relatively long. This layer is thought to adversely affect the photoelectric conversion efficiency.

The invention claimed is:

1. A photoelectric conversion device comprising at least one p-i-n type photoelectric conversion part including a first conductivity type semiconductor layer, a first i-type semiconductor layer, a second i-type semiconductor layer and a second conductivity type semiconductor layer stacked in this order, wherein
the first i-type semiconductor layer and the second i-type semiconductor layer are each made of microcrystalline silicon,
a crystallization ratio of the first i-type semiconductor layer is lower than a crystallization ratio of the second i-type semiconductor layer,
the second i-type semiconductor layer has a crystallization ratio changing layer at an interface between the first i-type semiconductor layer and the second i-type semiconductor layer,
a film thickness of the crystallization ratio changing layer is 5 nm to 30 nm, and
a change rate of a crystallization ratio of the crystallization ratio changing layer in a film-thickness direction is 0.017 to 0.10 nm$^{-1}$.

2. The device according to claim 1, wherein
the second i-type semiconductor layer is provided with a third i-type semiconductor layer on a side of the second conductivity type semiconductor layer, and
a crystallization ratio of the third i-type semiconductor layer is lower than the crystallization ratio of the second i-type semiconductor layer.

3. The device according to claim 1, wherein
the first conductivity type semiconductor layer is a p-type and the second conductivity type semiconductor layer is an n-type.

4. A photoelectric conversion device comprising at least one p-i-n type photoelectric conversion part including a first conductivity type semiconductor layer, a first i-type semiconductor layer, a second i-type semiconductor layer and a second conductivity type semiconductor layer stacked in this order, wherein
the first i-type semiconductor layer is mainly made of amorphous silicon,
the second i-type semiconductor layer is made of microcrystalline silicon,
a crystallization ratio of the first i-type semiconductor layer is lower than a crystallization ratio of the second i-type semiconductor layer,
a film thickness of the first i-type semiconductor layer is 3 nm or more and 12 nm or less,
the second i-type semiconductor layer has a crystallization ratio changing layer at an interface between the first i-type semiconductor layer and the second i-type semiconductor layer,
a film thickness of the crystallization ratio changing layer is 5 nm to 30 nm, and
a change rate of a crystallization ratio of the crystallization ratio changing layer in a film-thickness direction is 0.013 to 0.24 nm$^{-1}$.

5. The device according to claim 4, wherein
the second i-type semiconductor layer is provided with a third i-type semiconductor layer on a side of the second conductivity type semiconductor layer, wherein
the third i-type semiconductor layer is mainly made of amorphous silicon and has a film thickness of 3 nm or more and 12 nm or less.

* * * * *